United States Patent
Meitl et al.

(10) Patent No.: US 10,347,168 B2
(45) Date of Patent: Jul. 9, 2019

(54) SPATIALLY DITHERED HIGH-RESOLUTION

(71) Applicant: X-Celeprint Limited, Cork (IE)

(72) Inventors: Matthew Meitl, Durham, NC (US);
Ronald S. Cok, Rochester, NY (US);
Christopher Bower, Raleigh, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/808,126

(22) Filed: Nov. 9, 2017

(65) Prior Publication Data

US 2018/0130400 A1 May 10, 2018

Related U.S. Application Data

(60) Provisional application No. 62/420,529, filed on Nov. 10, 2016.

(51) Int. Cl.
*G09G 3/00* (2006.01)
*G09G 3/20* (2006.01)
(Continued)

(52) U.S. Cl.
CPC ........... *G09G 3/2051* (2013.01); *G09G 3/007* (2013.01); *G09G 3/342* (2013.01); *G09G 3/32* (2013.01);
(Continued)

(58) Field of Classification Search
CPC ........ G09G 3/2051; G09G 3/32; G09G 3/342; G09G 2320/0247; G09G 2300/0452; G09G 2320/0666
See application file for complete search history.

(56) References Cited

U.S. PATENT DOCUMENTS

| 4,746,202 A | 5/1988 | Perilloux et al. |
| 5,060,027 A | 10/1991 | Hart et al. |

(Continued)

FOREIGN PATENT DOCUMENTS

| CN | 103677427 A | 3/2014 |
| EP | 1662301 A1 | 5/2006 |

(Continued)

OTHER PUBLICATIONS

Cok, R. S. et al., Inorganic light-emitting diode displays using micro-transfer printing, Journal of the SID, 25(10):589-609, (2017).
(Continued)

*Primary Examiner* — Premal R Patel
(74) *Attorney, Agent, or Firm* — William R. Haulbrook; Michael D. Schmitt; Choate, Hall & Stewart LLP

(57) ABSTRACT

A high-resolution display includes a display substrate having an array of light-emitting display pixels disposed thereon for displaying an image comprising an array of image pixels. The total number of display pixels in the array of light-emitting display pixels is less than and evenly divides the total number of image pixels in the image in at least one dimension. An actuator physically moves a display substrate and light-emitting display pixels in one or two dimensions in a direction parallel to a surface of the display substrate. A controller controls the light-emitting operation of display pixels and controls physical location of the display pixels. In some embodiments, a controller controls an actuator to spatially interpolate the spatial location of display pixels at successive times and controls the light-emitting operation of display pixels to display a different subset of the image pixels at each successive time.

20 Claims, 17 Drawing Sheets

(51) Int. Cl.
*G09G 3/34* (2006.01)
*G09G 3/32* (2016.01)

(52) U.S. Cl.
CPC ............ *G09G 2300/0452* (2013.01); *G09G 2320/0247* (2013.01); *G09G 2320/0666* (2013.01)

(56) References Cited

U.S. PATENT DOCUMENTS

| | | |
|---|---|---|
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,815,303 A | 9/1998 | Berlin |
| 5,886,401 A | 3/1999 | Liu |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,552,740 B1 | 4/2003 | Wong et al. |
| 6,574,032 B1 | 6/2003 | Roddy et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,402,951 B2 | 7/2008 | Cok |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,179,401 B2 | 5/2012 | Ishii |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,599,118 B2 | 12/2013 | Cok |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,829,663 B2 | 9/2014 | Pohl et al. |
| 8,835,940 B2 | 9/2014 | Hu et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,896,505 B2 | 11/2014 | Cok et al. |
| 8,901,578 B2 | 12/2014 | Kobayakawa et al. |
| 8,902,152 B2 | 12/2014 | Bai et al. |
| 8,912,020 B2 | 12/2014 | Bedell et al. |
| 8,946,760 B2 | 2/2015 | Kim |
| 8,987,765 B2 | 3/2015 | Bibl et al. |
| 9,022,632 B2 | 5/2015 | Kim et al. |
| 9,048,449 B2 | 6/2015 | Kim et al. |
| 9,105,714 B2 | 8/2015 | Hu et al. |
| 9,105,813 B1 | 8/2015 | Chang |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,202,996 B2 | 12/2015 | Orsley et al. |
| 9,226,361 B2 | 12/2015 | Toth |
| 9,277,618 B2 | 3/2016 | Odnoblyudov et al. |
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,358,775 B2 | 6/2016 | Bower et al. |
| 9,362,348 B2 | 6/2016 | Lowenthal et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,601,356 B2 | 3/2017 | Bower et al. |

(56) References Cited

U.S. PATENT DOCUMENTS

| | | |
|---|---|---|
| 9,626,908 B2 | 4/2017 | Sakariya et al. |
| 9,640,715 B2 | 5/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,847,047 B2 | 12/2017 | Wu et al. |
| 9,860,955 B2 | 1/2018 | Kim et al. |
| 9,871,345 B2 | 1/2018 | Bower et al. |
| 9,929,053 B2 | 3/2018 | Bower et al. |
| 9,980,341 B2 | 5/2018 | Bower et al. |
| 9,997,501 B2 | 6/2018 | Bower et al. |
| 10,066,819 B2 | 9/2018 | Cok |
| 10,078,239 B2 | 9/2018 | Sugita et al. |
| 2001/0022564 A1 | 9/2001 | Youngquist et al. |
| 2002/0096994 A1 | 7/2002 | Iwafuchi et al. |
| 2004/0080483 A1 | 4/2004 | Chosa |
| 2004/0135160 A1 | 7/2004 | Cok |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0246811 A1 | 11/2006 | Winters et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0140630 A1 | 6/2009 | Kijima et al. |
| 2009/0146921 A1 | 6/2009 | Takahashi |
| 2009/0278142 A1 | 11/2009 | Watanabe et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0214245 A1 | 8/2010 | Hirota |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2011/0309378 A1 | 12/2011 | Lau et al. |
| 2012/0018745 A1 | 1/2012 | Liu et al. |
| 2012/0049222 A1 | 3/2012 | Yoshizumi et al. |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0193652 A1 | 8/2012 | Horng et al. |
| 2012/0206428 A1 | 8/2012 | Cok |
| 2012/0206499 A1 | 8/2012 | Cok |
| 2012/0212465 A1 | 8/2012 | White et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320566 A1 | 12/2012 | Namekata |
| 2012/0320581 A1 | 12/2012 | Rogers et al. |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0153934 A1 | 6/2013 | Meitl et al. |
| 2013/0161667 A1 | 6/2013 | Chen et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0027709 A1 | 1/2014 | Higginson et al. |
| 2014/0082934 A1 | 3/2014 | Cok |
| 2014/0084482 A1 | 3/2014 | Hu et al. |
| 2014/0085214 A1 | 3/2014 | Cok |
| 2014/0094878 A1 | 4/2014 | Gossler et al. |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0192079 A1 | 7/2014 | Lee et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0015517 A1 | 1/2015 | Zhao |
| 2015/0021632 A1 | 1/2015 | Taghizadeh et al. |
| 2015/0135525 A1 | 5/2015 | Bower |
| 2015/0137153 A1 | 5/2015 | Bibl et al. |
| 2015/0169011 A1 | 6/2015 | Bibl et al. |

(56) References Cited

U.S. PATENT DOCUMENTS

| | | |
|---|---|---|
| 2015/0170602 A1* | 6/2015 | Kang ................ G09G 5/00 345/204 |
| 2015/0179453 A1 | 6/2015 | Cheng et al. |
| 2015/0255438 A1 | 9/2015 | Oraw et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0103547 A1 | 4/2016 | Lu et al. |
| 2016/0131329 A1 | 5/2016 | Park et al. |
| 2016/0163765 A1* | 6/2016 | Hu ................ H01L 27/156 257/93 |
| 2016/0260388 A1 | 9/2016 | Yata et al. |
| 2016/0266697 A1 | 9/2016 | Cheng et al. |
| 2016/0343772 A1 | 11/2016 | Bower et al. |
| 2016/0351539 A1 | 12/2016 | Bower et al. |
| 2016/0364030 A1 | 12/2016 | Peana et al. |
| 2016/0370855 A1* | 12/2016 | Lanier ................ H04N 5/335 |
| 2017/0005244 A1 | 1/2017 | Bower et al. |
| 2017/0025075 A1 | 1/2017 | Cok et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0167703 A1 | 6/2017 | Cok |
| 2017/0186740 A1 | 6/2017 | Cok et al. |
| 2017/0187976 A1 | 6/2017 | Cok |
| 2017/0206845 A1 | 7/2017 | Sakariya et al. |
| 2017/0221266 A1* | 8/2017 | Schubert ................ G06T 19/006 |
| 2017/0250167 A1 | 8/2017 | Bower et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0338374 A1 | 11/2017 | Zou et al. |
| 2017/0352646 A1 | 12/2017 | Bower et al. |
| 2017/0352647 A1 | 12/2017 | Raymond et al. |
| 2017/0357127 A1 | 12/2017 | Cok et al. |
| 2017/0358717 A1 | 12/2017 | Cok et al. |
| 2018/0033853 A1 | 2/2018 | Bower et al. |
| 2018/0041005 A1 | 2/2018 | Bower et al. |
| 2018/0084614 A1 | 3/2018 | Bower et al. |
| 2018/0119931 A1 | 5/2018 | Bower et al. |
| 2018/0174932 A1 | 6/2018 | Cok et al. |
| 2018/0197471 A1 | 7/2018 | Rotzoll et al. |
| 2018/0211945 A1 | 7/2018 | Cok et al. |
| 2018/0226386 A1 | 8/2018 | Cok |
| 2018/0277525 A1 | 9/2018 | Cok et al. |
| 2018/0323180 A1 | 11/2018 | Cok |
| 2018/0340681 A1 | 11/2018 | Cok |

FOREIGN PATENT DOCUMENTS

| | | |
|---|---|---|
| EP | 2078978 A2 | 7/2009 |
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| JP | 2002-261335 A | 9/2002 |
| JP | 2010-103186 A | 5/2010 |
| JP | 2013-221965 A | 10/2013 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/011415 A1 | 1/2013 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Choi, H. W. et al., Efficient GaN-based Micro-LED Arrays, Mat. Res. Soc. Symp. Proc. 743:L6.28.1-L6.28.6 (2003).

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 Digest, 40(2):947-950 (2009).

Johnson, K. et al., Advances in Red VCSEL Technology, Advances in Optical Technologies, 2012:569379, 13 pages (2012).

Kasahara, D. et al, Nichia reports first room-temperature blue/'green' VCSELs with current injection, Appl. Phys. Express, 4(7):3 pages (2011).

Koma, N. et al., 44.2: Novel Front-light System Using Fine-pitch Patterned OLED, SID, 08:655-658 (2008).

Lee, S. H. etal, Laser Lift-Offof GaN Thin Film and its Application to the Flexible Light Emitting Diodes, Proc. of SPIE 8460:846011-1-846011-6 (2012).

Matioli, E. et al., High-brightness polarized light-emitting diodes, Light: Science & Applications, 1:e22:1-7 (2012).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Seurin, J.F. et al, High-power red VCSEL arrays, Proc. of SPIE 8639:1-9 (2013).

Yaniv et al., A 640 x 480 Pixel Computer Display Using Pin Diodes with Device Redundancy, 1988 International Display Research Conference, IEEE, CH-2678-1/88:152-154 (1988).

Yoon, J. et al., Heterogeneously Integrated Optoelectronic Devices Enabled by MicroTransfer Printing, Adv. Optical Mater. 3:1313-1335 (2015).

Bower, C. A. et al., Transfer Printing: An Approach for Massively Parallel Assembly of Microscale Devices, IEE, Electronic Components and Technology Conference, (2008).

Cok, R. S. et al., 60.3: AMOLED Displays Using Transfer-Printed Integrated Circuits, Society for Information Display, 10:902-904, (2010).

(56) References Cited

OTHER PUBLICATIONS

Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100, (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Trindade, A.J. et al., Precision transfer printing of ultra-thin AlInGaN micron-size light-emitting diodes, Crown, pp. 217-218, (2012).

\* cited by examiner

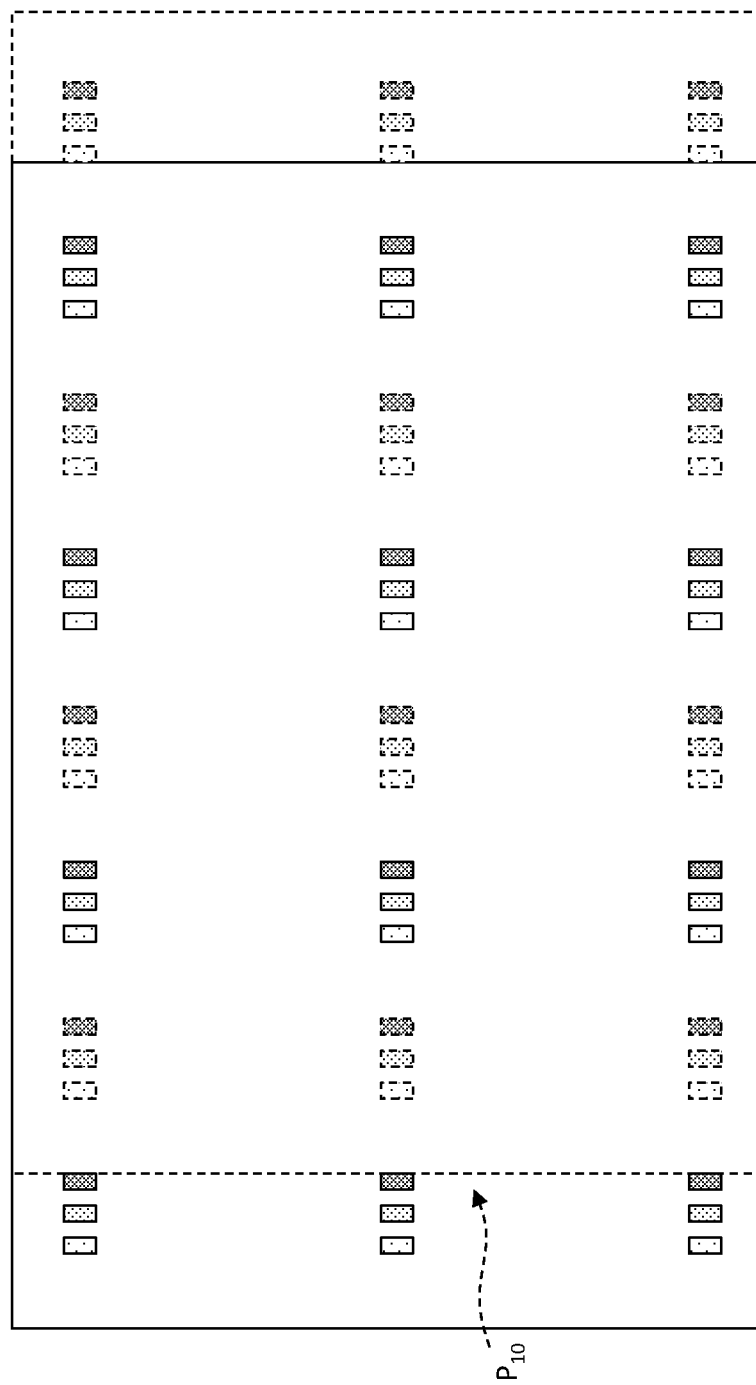

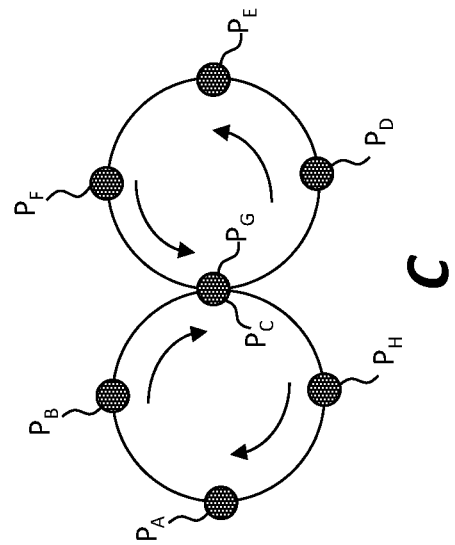
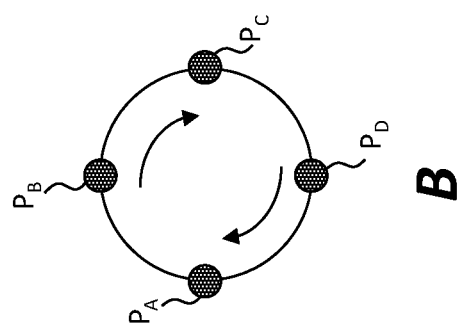
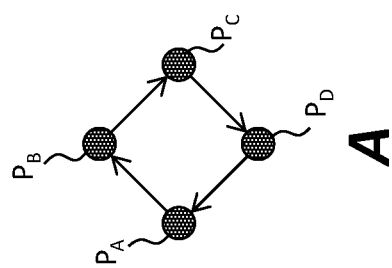
FIG. 8

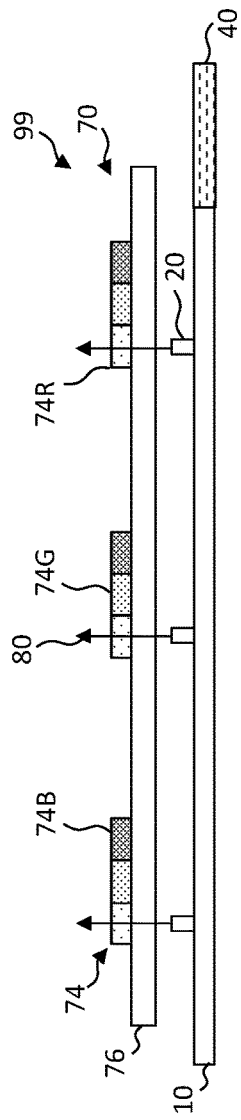
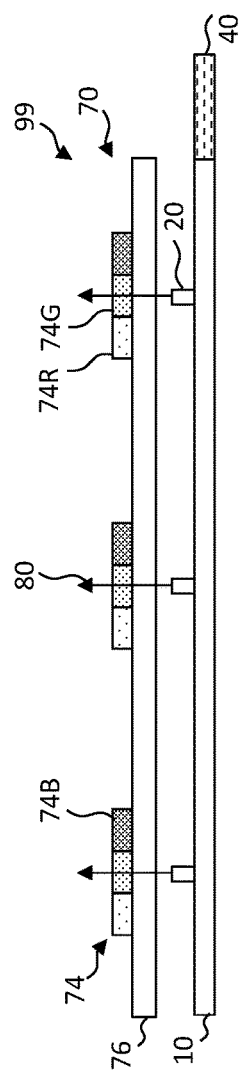
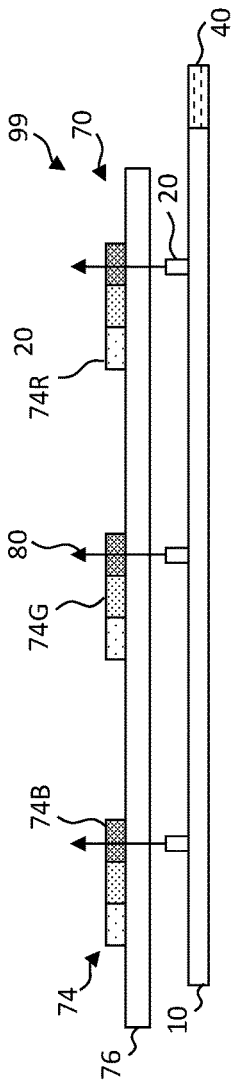
FIG. 13A
FIG. 13B
FIG. 13C

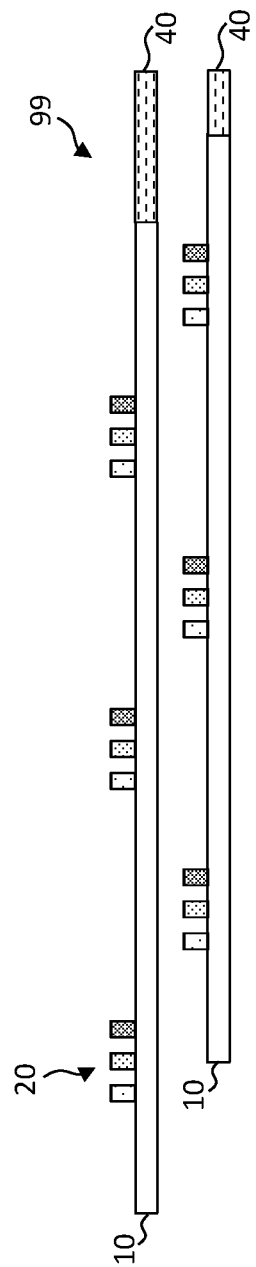

SPATIALLY DITHERED HIGH-RESOLUTION

PRIORITY APPLICATION

This application claims the benefit of U.S. Provisional Patent Application No. 62/420,529, filed Nov. 10, 2016, entitled "Spatially Dithered High-Resolution Display", the disclosure of which is incorporated by reference herein in its entirety.

FIELD OF THE INVENTION

The present invention relates generally to high-resolution displays.

BACKGROUND OF THE INVENTION

Displays are widely used to present information to viewers. In general, more information can be presented more clearly with displays having greater resolution. Moreover, displays with greater resolution are often more pleasing to viewers.

A variety of techniques have been proposed for presenting lower-resolution imagery on a higher-resolution display, for example using inter-pixel interpolation to increase the number of pixels in the image to match the number of pixels in the higher-resolution display. Other techniques, for example as taught in U.S. Pat. No. 8,179,401 use dither patterns for sequentially displaying groups of pixels, particularly for addressing motion artifacts in color sequential displays, but does not actually improve the apparent resolution of the display.

U.S. Pat. No. 6,574,032 discusses the use of a spatial light modulator to move the apparent location of light emitted by pixels. The spatial light modulator effectively enlarges the apparent pixel size to improve the fill factor. However, this approach does not actually improve the apparent resolution of the display.

U.S. Pat. No. 6,552,740 describes a printer using a spatial light modulator and proposes to duplicate pixel data by imaging the same data at multiple sites. This method can be used to create multiple overlapped images for the purpose of minimizing effects of pixel site defects in the spatial light modulator. Dithering is also proposed as a method for increasing the effective image resolution by printing a first image with the spatial light modulator in a first position, printing a second image with the spatial light modulator in a second position, and so on. This method can be used to increase image resolution by a multiple of two or four, depending on the dither pattern. However, this approach requires moving a relatively large spatial light modulator and requires a backlight.

There is a need, therefore, for devices, systems and methods for improving the apparent resolution of displays.

SUMMARY OF THE INVENTION

In one aspect, the present invention is directed to a high-resolution display, comprising: a display substrate; an array of light-emitting display pixels disposed on the display substrate; at least one actuator for physically moving the display substrate and the array of light-emitting display pixels to different physical locations in at least one dimension in a direction parallel to a surface of the display substrate; a controller for controlling the light-emitting operation of the display pixels and for controlling a spatial location of the display pixels; and wherein the controller controls the at least one actuator to interpolate the spatial location of the display pixels at successive times and controls the light-emitting operation of the display pixels to display a different subset of image pixels in an image at each successive time, wherein a total number of display pixels in the array of light-emitting display pixels is less than and evenly divides a total number of image pixels in the image in at least one dimension (e.g., wherein the number of image pixels is an integral multiple greater than one of the number of display pixels in at least one dimension).

In certain embodiments, the display pixels are color pixels comprising two or more light-emitting sub-pixels and the controller controls the sub-pixels to emit light of different colors. In certain embodiments, each display pixel is a single-color display pixel and adjacent display pixels emit different single-colors of light.

In certain embodiments, each spatial location of the display pixels that the controller controls the at least one actuator to move the display substrate to at a successive time of the successive times corresponds to a relative location of image pixels in the image displayed by the display pixels at the successive time.

In certain embodiments, a total number of spatial locations the controller controls the at least one actuator to move to is the same as the total number of image pixels in the image.

In certain embodiments, the spatial locations are interpolated in one dimension. In certain embodiments, the spatial locations are interpolated in two directions. In certain embodiments, the two directions are two orthogonal directions.

In certain embodiments, the spatial locations at successive times correspond to adjacent image pixels in the image.

In certain embodiments, the controller controls the at least one actuator to move continuously along a dither pattern.

In certain embodiments, each display pixel is separated from a neighboring pixel by a pixel separation distance and each of the at least one actuator has a range of motion for moving the display substrate that is at least equal to the pixel separation distance (e.g., at least equal to twice the pixel separation distance).

In certain embodiments, the display comprises an actuator for physically moving the display substrate and the array of light-emitting display pixels in a direction orthogonal to a surface of the display substrate on which the array of light-emitting display pixels are disposed.

In certain embodiments, the display substrate is substantially transparent and the high-resolution display comprises at least one additional display substrate each comprising an array of light-emitting display pixels disposed thereon and at least one actuator for physically moving the additional display substrate and the array of light-emitting display pixels disposed thereon to different spatial locations at least one dimension parallel to a surface of the display substrate, wherein the display substrate and the at least one additional display substrate form a stack of display substrates.

In certain embodiments, each display pixel is separated from a neighboring display pixel by a pixel separation distance and each of the at least one actuator has a range of motion for moving the display substrate of at least one half (e.g., at least two thirds or at least three quarters) of the pixel separation distance.

In certain embodiments, each display pixel is separated from a neighboring pixel by a pixel separation distance, wherein the display pixels are color pixels comprising two or more light-emitting sub-pixels, and the two or more light-emitting sub-pixels in a color pixel are separated by a distance that is less than or equal to one quarter of the pixel separation distance.

In certain embodiments, the light-emitting pixels comprise inorganic micro-light-emitting diodes comprising at least one of a length, a width, and a thickness that is less than or equal to twenty microns (e.g., less than or equal to ten microns, five microns, two microns, or one micron).

In certain embodiments, each sub-pixel comprises at least one micro-transfer printed micro-light-emitting diode comprising a fractured or separated tether.

In certain embodiments, each light-emitting display pixel in the array of light-emitting display pixels comprises an active-matrix pixel controller.

In certain embodiments, the at least one actuator is (i) one or more piezo actuators disposed to move the display substrate in one dimension; (ii) two or more piezo actuators disposed to move the display substrate in two dimensions (e.g., two orthogonal dimensions); or (iii) three or more piezo actuators disposed to move the display substrate in three dimensions (e.g., three orthogonal dimensions).

In certain embodiments, the display comprises an optical structure disposed over the array of display pixels such that light emitted by the display pixels is optically processed by the optical structure, wherein the at least one actuator is for moving the display substrate relative to the optical structure.

In certain embodiments, the at least one actuator moves the display substrate in at least one of (i) at least a portion of a straight line segment, a curved line segment, a circle, a circular line segment, a sinusoidal line segment, a sine wave, and (ii) a resonant mechanical mode in one or both of a horizontal plane parallel and a vertical plane orthogonal to a surface of the display substrate on which the array of light-emitting display pixels are disposed.

In certain embodiments, the display comprises a head set, wherein at least the display substrate, the array of light-emitting display pixels, and the at least one actuator are mounted to the head set.

In another aspect, the present invention is directed to a method of displaying images on a high-resolution display using spatial dithering, wherein the high-resolution display comprises a display substrate, an array of light-emitting display pixels disposed on the display substrate, at least one actuator for physically moving the display substrate and the array of light-emitting display pixels to different physical locations in at least one dimension in a direction parallel to a surface of the display substrate, and a controller for controlling the light-emitting operation of the display pixels and for controlling a spatial location of the display pixels and the method comprises the steps of: (a) emitting light from the array of display pixels while the display pixels are in an initial spatial location, wherein the emitted light corresponds to a subset of image pixels of an image and a total number of display pixels in the array of light-emitting display pixels is less than and evenly divides a total number of image pixels in the image in at least one dimension (e.g., wherein the number of image pixels is an integral multiple greater than one of the number of display pixels in at least one dimension); (b) controlling, by the controller, movement of one or more of the at least one actuator to move the display substrate such that the array of display pixels are interpolated to a different spatial location along a dither pattern; (c) emitting light from the array of display pixels while the array is in the different spatial location along the dither pattern, wherein the light emitted from the array of display pixels while in the different spatial location corresponds to a different subset of image pixels in the image than the subset of image pixels in the; and (d) repeating step (b) and step (c) until light has been emitted from the array of display pixels in each spatial location, thereby displaying the image.

In certain embodiments, the dither pattern is a 2×2 pattern, a 3×3 pattern, a 4×4 pattern, or a 5×5 pattern. In certain embodiments, spatial locations are interpolated along the dither pattern in one dimension. In certain embodiments, spatial locations are interpolated along the dither pattern in two directions. In certain embodiments, the two directions are two orthogonal directions.

In certain embodiments, each pair of successive spatial locations interpolated along the dither pattern corresponds to adjacent subsets of image pixels in the image.

In certain embodiments, at least one pair of successive spatial locations interpolated along the dither pattern corresponds to non-adjacent subsets of image pixels in the image (e.g., wherein one of the pair of successive spatial locations is the initial spatial location).

In certain embodiments, the array of display pixels are interpolated to successive spatial locations along the dither pattern by interpolating along at least a portion of a straight line segment, a curved line segment, a circle, a circular line segment, a sinusoidal line segment, or a sine wave.

In certain embodiments, the method comprises loading a second image to be displayed while moving, in response to the controller actuating the at least one actuator, the array of display pixels to the initial spatial position from a non-adjacent spatial location.

In certain embodiments, the high-resolution display comprises an orthogonal actuator for physically moving the display substrate and the array of light-emitting display pixels in a direction orthogonal to a surface of the display substrate on which the array of light-emitting display pixels are disposed, and the method comprises: controlling, by the controller, movement of the orthogonal actuator to move the display substrate such that the array of display pixels are interpolated to an orthogonal spatial location along the dither pattern, wherein the orthogonal spatial location is a spatial location that lies above or below a plane of the initial spatial location.

Some embodiments of the present invention provide a high-resolution display suitable for small, light-weight display systems at a relatively low cost and in a robust structure.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 2A-2D illustrate display pixel locations for a 2×2 spatial dither, according to illustrative embodiments of the present invention;

FIG. 8 illustrates non-rectilinear dither patterns, according to illustrative embodiments of the present invention;

FIGS. 13A-13C are cross sections of a high-resolution display comprising an optical structure incorporating color filters at different times, according to illustrative embodiments of the present invention;

FIG. 14 is a cross section of a high-resolution display comprising a stack of display substrates, according to illustrative embodiments of the present invention.

Figure 1:
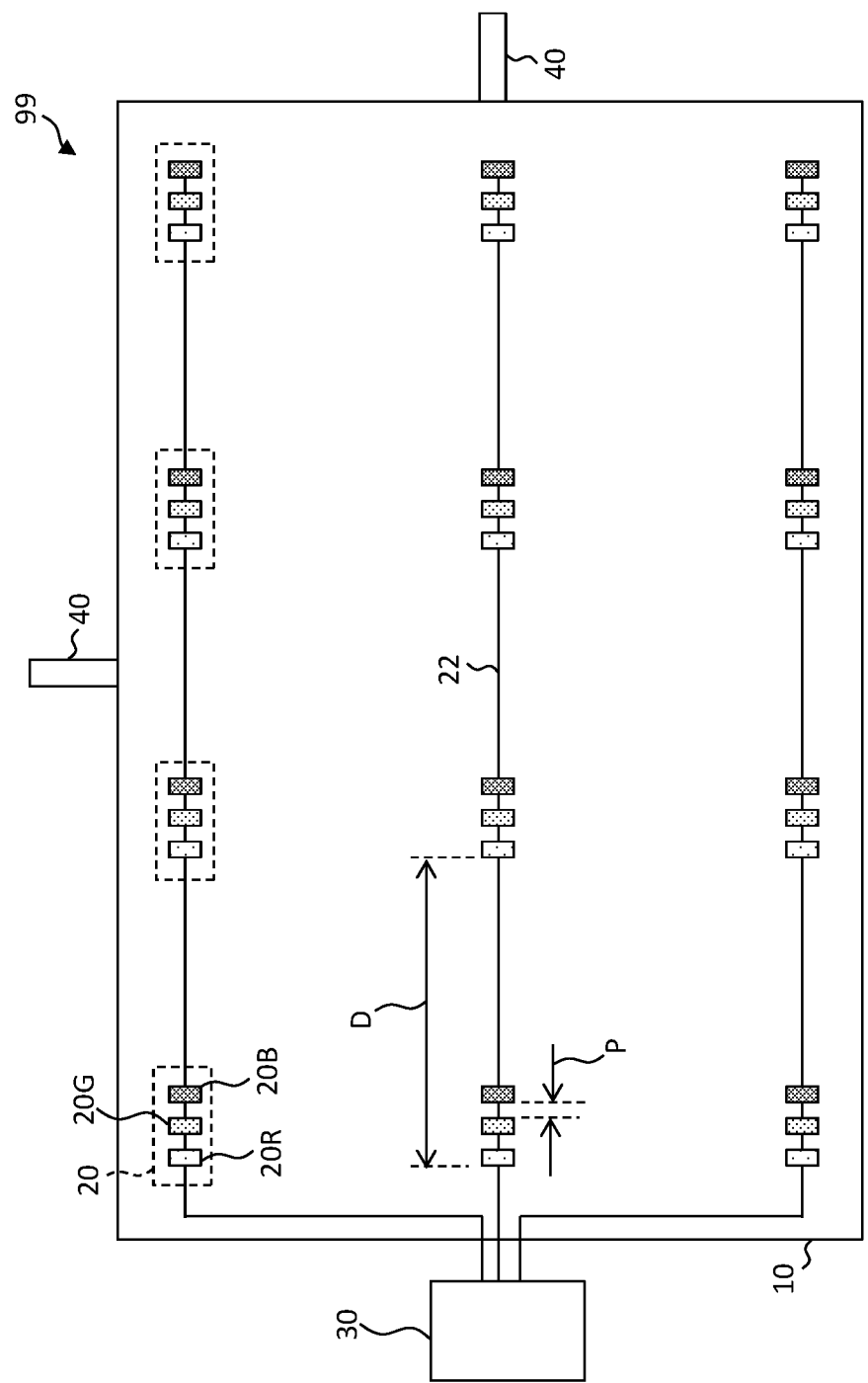
FIG. 1 is a plan view schematic illustration of a display, according to illustrative embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 5:
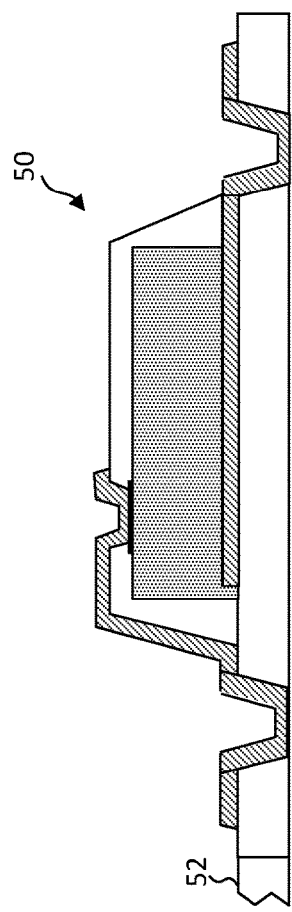
FIG. 5 is a cross section of a micro-LED, according to illustrative embodiments of the present invention.

Referring to FIG. 1, a high-resolution display 99 in accordance with some embodiments of the present invention includes a display substrate 10 having an array of light-emitting display pixels 20 disposed thereon. The high-resolution display can be used to display an image comprising an array of image pixels. The display substrate 10 can be, for example, a glass substrate or a thin glass substrate having a thickness less than one mm, less than 0.5 mm, or less than 0.25 mm. The display substrate 10 can be rigid or flexible. The light-emitting display pixels 20 can be inorganic micro light-emitting-diodes 50 (as shown in FIG. 5) for example having at least one of a length, a width, and thickness that is less than or equal to twenty microns, ten microns, five microns, two microns, or one micron. The display pixels 20 can have a pixel separation distance of D and a sub-pixel separation distance of P. The micro light-emitting-diodes 50 can be micro-transfer printed LEDs having a fractured or separated tether 52.

The total number of display pixels 20 in the array of light-emitting display pixels is less than and evenly divides the total number of image pixels in the image in at least one dimension. That is, the total number of image pixels in images displayed on the display is an integral multiple of the total number of display pixels 20 in at least one dimension and, in some embodiments, in two orthogonal directions. For example, a display substrate 10 can include a 640×480 array of display pixels 20 and an image can include a 1280×960 array of image pixels so that the image has twice as many image pixels as the display substrate 10 has display pixels 20 in each of two dimensions and the image has four times as many image pixels as the display substrate 10 has display pixels 20.

One or more actuators 40 are disposed to physically move the display substrate 10 and light-emitting display pixels 20 in one or two dimensions in a direction parallel to a surface of the display substrate 10. For example, as shown in FIG. 1, a single actuator 40 can be disposed to press against each of two orthogonal sides of a rectangular display substrate 10 in a direction orthogonal to the corresponding edge of the rectangular display substrate 10 against which the actuators 40 press. Thus, the two actuators 40 together can move the display substrate 10 in two orthogonal directions in a plane horizontal to the display substrate 10 surface. In some embodiments (not shown in FIG. 1), two or more actuators 40 are disposed to move the display substrate 10 in a common direction. Such a multi-actuator 40 arrangement can help to prevent the display substrate 10 from rotating. Useful actuators 40 include piezoelectric actuators.

A display controller 30 controls the light-emitting operation of the display pixels 20 and controls the physical location of the display pixels 20 in space by controlling the one or more actuators 40. A display controller 30 can be, for example, an integrated circuit that is electrically connected to the display pixels 20 with wires 22 and that electrically controls the display pixels 20 to emit light and electrically controls the actuator 40 to move the display substrate 10. In some embodiments, a display controller 30 comprises two or more sub-controllers, for example one sub-controller to control light emission and one sub-controller to control actuator motion (e.g., wherein each sub-controller is an integrated circuit). Sub-controllers of a display controller 30 can be spatially separate. A display controller 30 controls an actuator 40 to spatially interpolate the spatial location of display pixels 20 (e.g., along a dither pattern, as described subsequently) at successive times and controls light-emitting operation of the display pixels 20 to display a different subset of the image pixels at each successive time.

In a simple example, a display substrate 10 includes a 640×480 array of display pixels 20 and an image includes a 1280×960 array of image pixels so that the image has twice as many image pixels as the display substrate 10 has display pixels 20 in each of two dimensions.

Figure 2A:
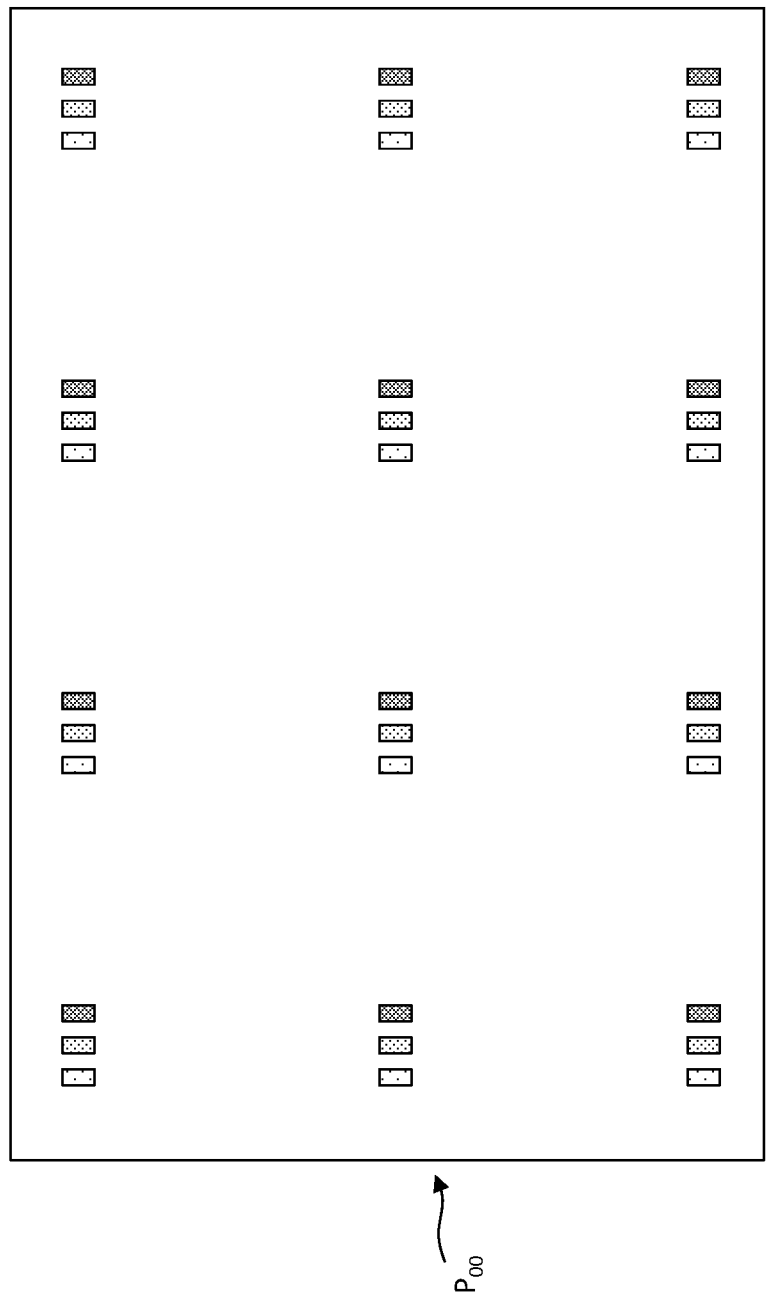

Referring to FIG. 2A, at a first time $T_0$ the display pixels 20 and the display substrate 10 are at a first location $P_{00}$, for example at rest with the actuator 40 in a neutral position. While in this position, the display controller 30 controls the display pixels 20 to emit light corresponding to every other image pixel in each of two orthogonal directions with an offset of zero in both dimensions, for example emitting light corresponding to the first, third, fifth and so on image pixels in each row and column. Thus, the display pixels 20 display a first subset of the image.

Referring to FIG. 2B, at a second time $T_1$ the display pixels 20 and the display substrate 10 are at a second location $P_{10}$, for example spatially offset in the x direction by a distance that is one half of the pixel separation distance D (i.e., that is midway in the x dimension between the pixels in the neutral position $P_{00}$). While in this position, the display controller 30 controls the display pixels 20 to emit light corresponding to every other image pixel in each of two orthogonal directions with an offset of one pixel in the x dimension and no offset in the y dimension, for example emitting light corresponding to the second, fourth, sixth and so on image pixels in each row and the first, third, fifth and so on image pixels in each column. Thus, the display pixels 20 display a second subset of the image.

Figure 2C:
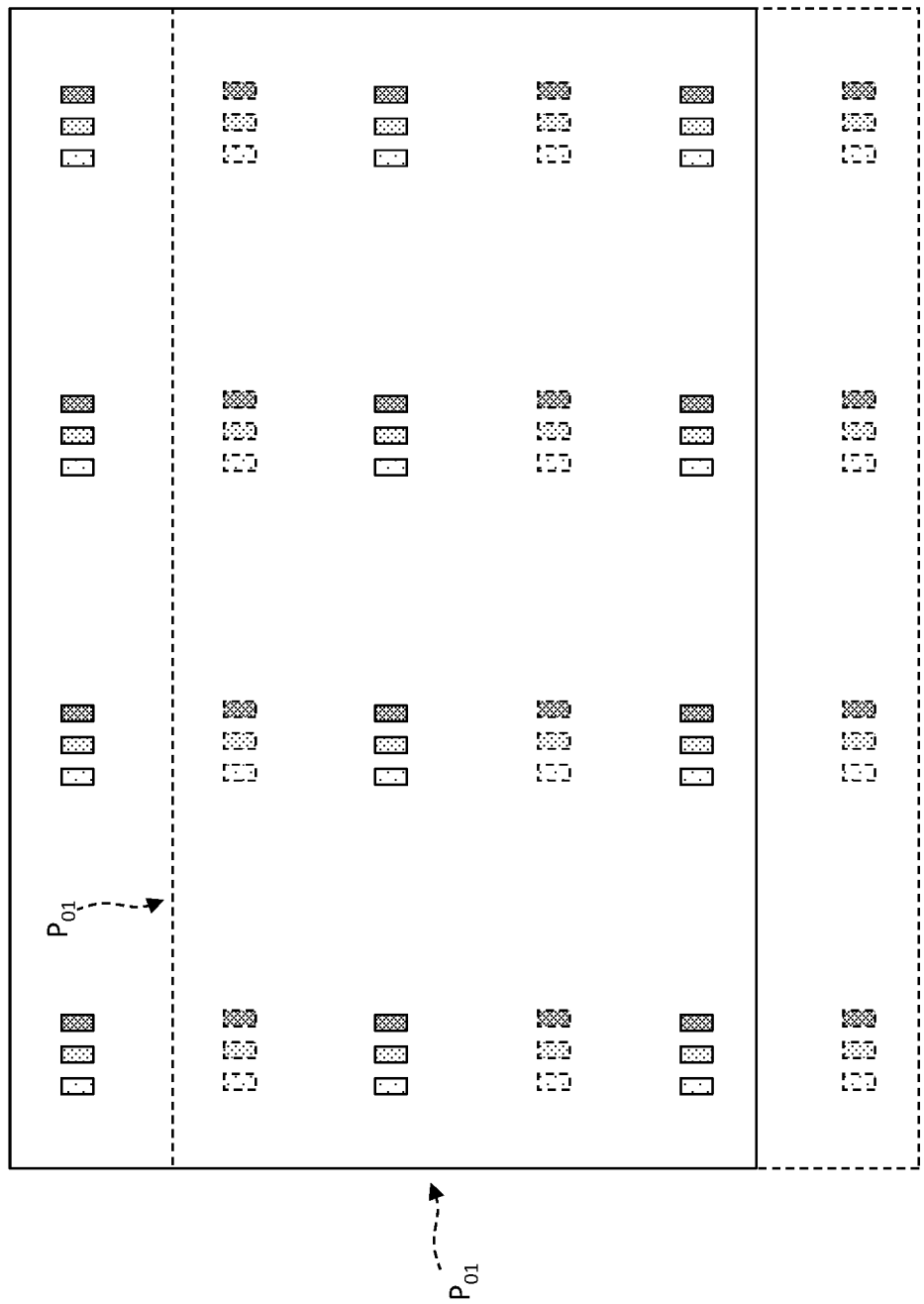

Referring to FIG. 2C, at a third time $T_2$ the display pixels 20 and the display substrate 10 is at a third location $P_{01}$, for example spatially offset in the y direction by a distance that is one half of the pixel separation distance D, that is midway in the y dimension between the pixels in the neutral position $P_{00}$. While in this position, the display controller 30 controls the display pixels 20 to emit light corresponding to every other image pixel in each of two orthogonal directions with an offset of zero pixels in the x dimension and an offset of one pixel in the y dimension, for example emitting light corresponding to the first, third, fifth and so on image pixels in each row and the second, fourth, sixth and so on image pixels in each column. Thus, the display pixels 20 display a third subset of the image.

Figure 2D:
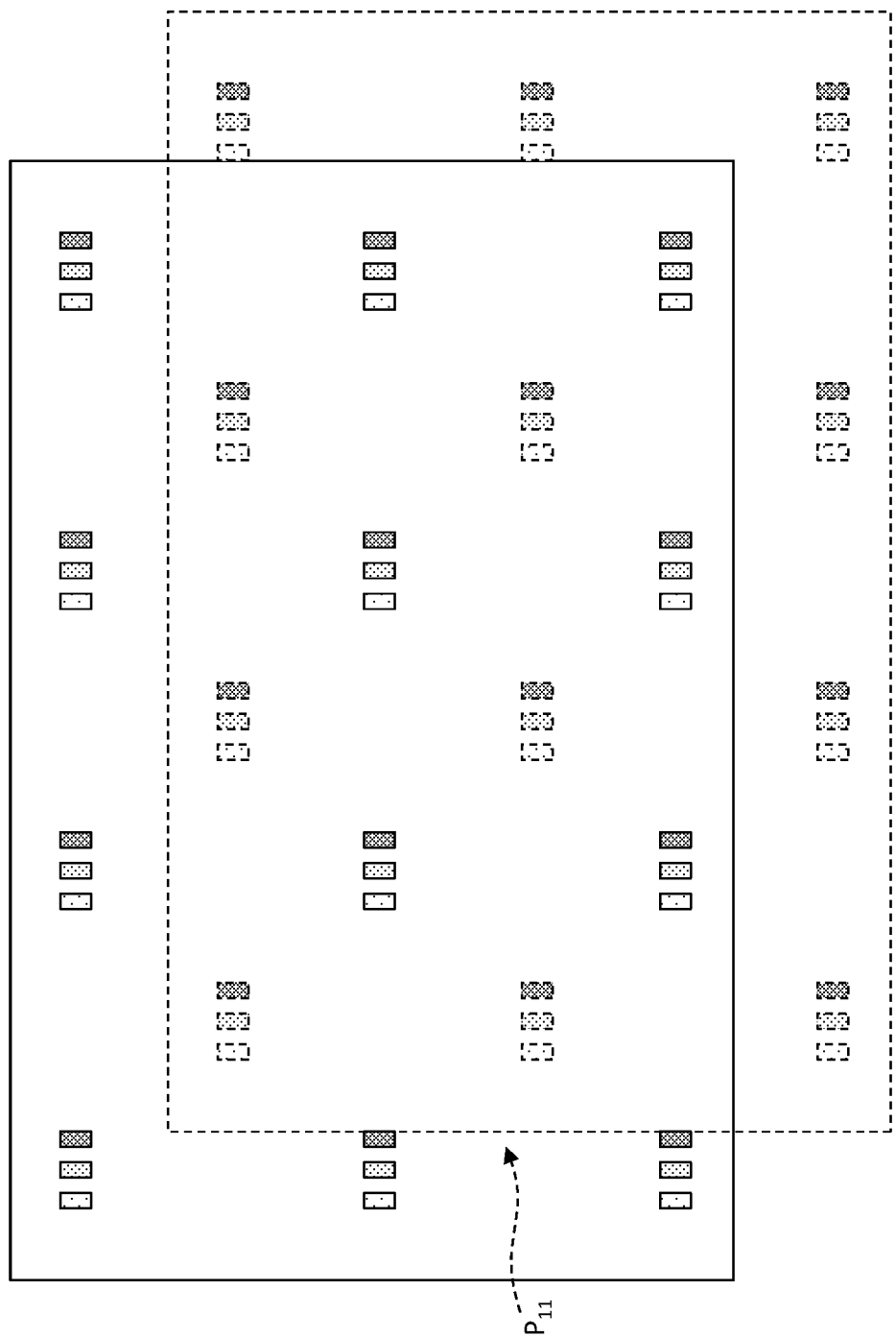
Figure 3:
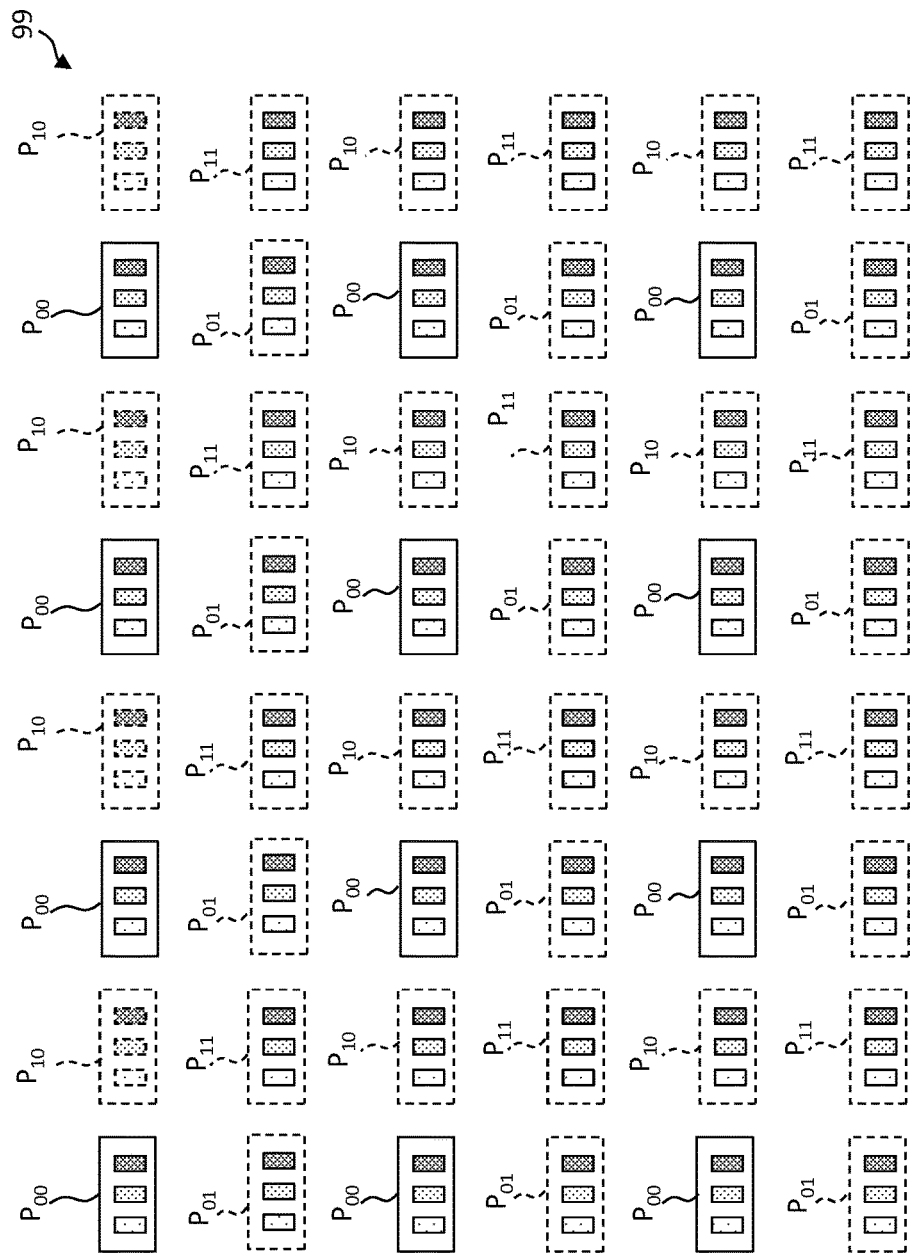
FIG. 3 is a plan view schematic illustration of the interpolated display pixel locations for the 2×2 dither pattern of FIGS. 2A-2D, according to illustrative embodiments of the present invention.

Referring to FIG. 2D, at a fourth time $T_3$ the display pixels 20 and the display substrate 10 is at a fourth location $P_{11}$, for example spatially offset in the y direction and in the x direction by a distance that is one half of the pixel separation distance D, that is midway in the x and y dimensions between the pixels in the neutral position $P_{00}$. While in this position, the display controller 30 controls the display pixels 20 to emit light corresponding to every other image pixel in each of two orthogonal directions with an offset of one pixel in the x dimension and an offset of one pixel in the y dimension, for example emitting light corresponding to the second, fourth, sixth and so on image pixels in each row and the second, fourth, sixth and so on image pixels in each column. Thus, the display pixels 20 display a fourth subset of the image and the complete image is displayed at the image resolution in a 2×2 dither pattern over the time taken by times $T_1$, $T_2$, $T_3$, and $T_4$, as shown in FIG. 3.

Figure 4:
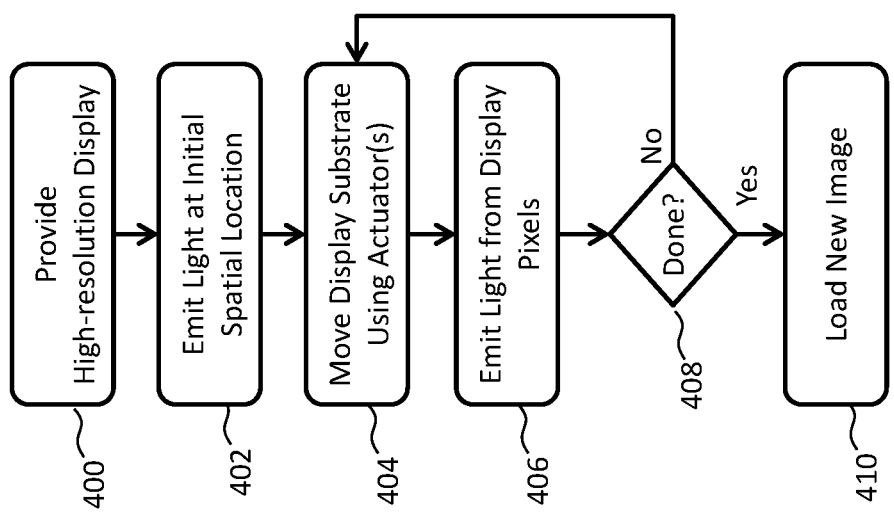
FIG. 4 is a flow chart of an exemplary method of displaying images on a high-resolution display, according to illustrative embodiments of the present invention.

FIG. 4 is a flow chart of an exemplary method to display one or more images using a high-resolution display in accordance with some embodiments of the present invention. In a providing step 400, a high-resolution display 99 is provided. For example, a high-resolution display 99 in accordance with FIG. 1 can be provided. In an initial emitting step 402, an array of display pixels 20 emits light (e.g., corresponding to a first subset of image pixels of the image). In a moving step 404, one or more actuators 40 move a display substrate 10 on which the display pixels 20 are disposed. The display pixels 20 are interpolated along a dither pattern as a result of the one or more actuators 40 moving the display substrate 10 in correspondence with the dither pattern (e.g., in accordance with FIGS. 2A-2D and FIG. 3, as described above). In an emitting step 406, light is emitted from light-emitting display pixels 20 disposed on the display substrate 10. For example, light emitted from the display pixels 20 can correspond to image pixels in the image being displayed during the method. In some embodiments, light is continuously emitted from display pixels 20 as the one or more actuators 10 move the display substrate (e.g., step 404 and step 406 occur simultaneously).

In a determining step 408, a determination is made as to whether each spatial location in the dither pattern has been interpolated for the image. If not, then the method repeats the moving step 404 and the emitting step 406 (e.g., multiple times). For example, in some embodiments using a 2×2 dither pattern, a moving step 404 and emitting step 406 are performed three times for each image (e.g., frame of a video). If each spatial location has been interpolated, then a new image is loaded in a loading step 410. In some embodiments, a new image is loaded into the display 99 (e.g., into a controller 30 of the display 99) as the one or more actuators 40 move the array of display pixels 20 back to an initial spatial location. In some embodiments, a new image is loaded after display pixels 20 return to an initial spatial position.

In order to avoid perceptible flicker in a display, it is necessary to display the image pixel subsets at a rate greater than, for example 30 frames per second, the frame rate of the commercial analog NTSC television standard. In some embodiments of the present invention, a high-resolution display 99 is a relatively small display, for example having a diagonal size of a few centimeters, that can be disposed in a head-mounted display. However, users viewing near-to-eye head-mounted displays have a high expectation for display resolution and image quality. In certain embodiments, micro-transfer printed micro-LEDs 50 having a size, for example, of ten or 20 microns in a dimension are used in a high-resolution micro-display.

For example, in some embodiments, a high-resolution display 99 has a pixel separation of 50 microns for a native resolution of 20 pixels per millimeter. In some embodiments, a high-resolution display 99 has a pixel separation of 25 microns and an effective resolution of 40 pixels per millimeter in both row and column directions. If such a display is used with a 4×4 dither pattern to display an image with four times as many image pixels as display pixels 20 on the display substrate 10 in each dimension, the entire image can be displayed in 16 time periods with an effective resolution of 80 pixels per millimeter, an extremely high resolution.

Figure 6:
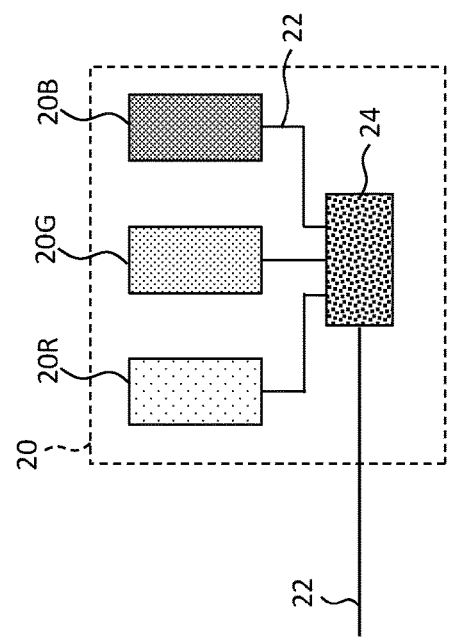
FIG. 6 is a plan view schematic illustration of color display pixel comprising a pixel controller (e.g., an active-matrix pixel controller), according to illustrative embodiments of the present invention.

In some embodiments of the present invention, as illustrated in FIG. 6, display pixels 20 include a pixel controller 24, for example a small integrated circuit that provides active-matrix control to a display pixel 20. A pixel controller 24 can digitally control micro-LEDs 50 with a pulse width modulation scheme and can be addressed using an active-matrix control method from the display controller 30 (which can include, for example, separate row and column drivers). In some embodiments, a display controller 30 and pixel controller 24 together with micro-LEDs 50 can load rows of data at a rate greater than 50 MHz per bit. In some embodiments, rows of eight-bit pixel values can be loaded into the display at 6 MHz. For example, in a display with 640 columns x 480 rows, such a loading rate enables a native frame rate of 12500 frames per second. Using a 4×4 dither pattern, a high-resolution display 99 can operate at one sixteenth that rate or 781 frames per second, well above the required 30 frames per second to avoid flicker. For an image having 1080 rows (such as in, for example, a standard high-definition television) and using a 4×4 dither pattern, thereby achieving an effective 8 k×4 k display resolution, the frame rate is 347 frames per second. Even a 16 k×8 k resolution is readily achievable.

In some embodiments, it is not only necessary to provide data at a rate sufficient to avoid flicker, it is necessary to move a display substrate 10 to a number of positions to display the data at a corresponding rate. For example, a display using a 4×4 dither pattern moves a display substrate to 16 locations to display a single image (e.g., frame of a video). In some embodiments, an actuator 40 moves a display substrate 10 a distance up to the pixel separation distance D, for example up to 50 microns. Commercially available piezoelectric actuators 40 can move distances of a millimeter without difficulty at a rate of 350 mm per second (i.e., one micron in 2.86 microseconds). For example, a high-resolution display 99 with a 50-micron pixel separation distance D using a commercially available piezoelectric actuator capable of 350 mm per second movement and a 4×4 dither pattern requires a maximum movement in each dimension of movement (e.g., x- and y-dimensions) of 37.5 microns, which takes 107 microseconds (i.e., can occur at a rate of 9324 movements per second) using. Sixteen movements (e.g., one to each position of the 4×4 pattern) would therefore require at most about 1712 microseconds and yield a frame rate limited by the piezoelectric actuators 40 of about 584 frames per second. Thus, a piezoelectric actuator 40 can enable useful frame rates. Micro-LED displays having pixel separation distances D less than 100 microns have been built and in accordance with some embodiments using a 4×4 spatial dither pattern can operate at 292 frames per second. Thus, some embodiments of the present invention provide a useful high-resolution display 99.

In some embodiments, display pixels 20 are color pixels having two or more light-emitting sub-pixels and a display controller 30 controls the sub-pixels to emit light of different colors. Referring to FIGS. 1 and 5, in some embodiments, display pixels 20 include red, green, and blue colored sub-pixels, 20R, 20G, 20B. In some embodiments, a color display requires three times as much data communication (i.e., due to the presence of three subpixels per pixel) which reduces the frame rate. However, in an analogous high-resolution display 99 as the example given above, the frame rate remains about 100 frames per second, still well above the threshold necessary to avoid image display flicker.

To ensure that image pixels are displayed at correct locations in a high-resolution display 99 in accordance with some embodiments of the present invention, the location of display pixels 20 at a time can correspond to the relative location of the image pixels in the image displayed by the display pixels 20. That is, the locations moved to by the display pixels 20 in the display 99 correspond to discrete locations of image pixels in an image being displayed. Therefore, in some embodiments, the total number of display pixel spatial locations is the same as the number of image pixels in an image being displayed (e.g., as illustrated in FIG. 3), wherein only a subset of the image pixels are instantaneously displayed at a particular time.

In some embodiments, and as illustrated in the figures, spatial locations are interpolated in two dimensions (e.g., using a two-dimensional dither pattern). In some embodiments, spatial locations are interpolated in only one dimension (e.g., using a one-dimensional dither pattern).

Image pixels in a dither pattern can be displayed in any order (e.g., an arbitrary order). In some embodiments, the number of display substrate 10 movements are reduced by displaying image pixels adjacent in one dimension at successive times. For example, with reference to FIG. 3, a display substrate 10 can be moved from position $P_{00}$ to $P_{10}$ to $P_{11}$ to $P_{01}$ to $P_{00}$, so that the display substrate 10 only moves the smallest distance possible for each movement, thus keeping each movement time as short as possible. In some embodiments, all movements are to spatially adjacent locations except one, so that only some of the spatial locations at successive times are adjacent. For example, a one-dimensional dither pattern can be used, wherein each movement moves to a spatially adjacent location progressively further away from an initial position except for a movement to reset a display substrate 10 to the initial position. In some embodiments, a large movement (e.g., relative to the size of movement to spatially adjacent locations) is used a limited number of times (e.g., once per image frame) and overlaps with the time needed to load a new image frame into a display controller 30. Time available for loading scales with magnitude of the large movement (i.e., a larger movement takes a longer time to move). Therefore, moving a display substrate 10 to spatially adjacent locations can reduce time and energy needed to move the display substrate 10, can improve high-resolution display 99 efficiency, and can increase the display frame rate, thereby reducing flicker. In some embodiments, only some movements are to spatially adjacent locations. For example, with reference to FIG. 3, a display substrate 10 can be moved from $P_{00}$ to $P_{10}$ to $P_{01}$ to $P_{11}$ to $P_{00}$ from the diagonally opposite corner of the dither pattern to the initial $P_{00}$ position. The larger spatial movement from $P_{11}$ to $P_{00}$ can allow time for a new image frame to be loaded into a display controller 30. In some embodiments, multiple movements (interpolations) along a dither pattern are to non-adjacent spatial locations.

Figure 7:
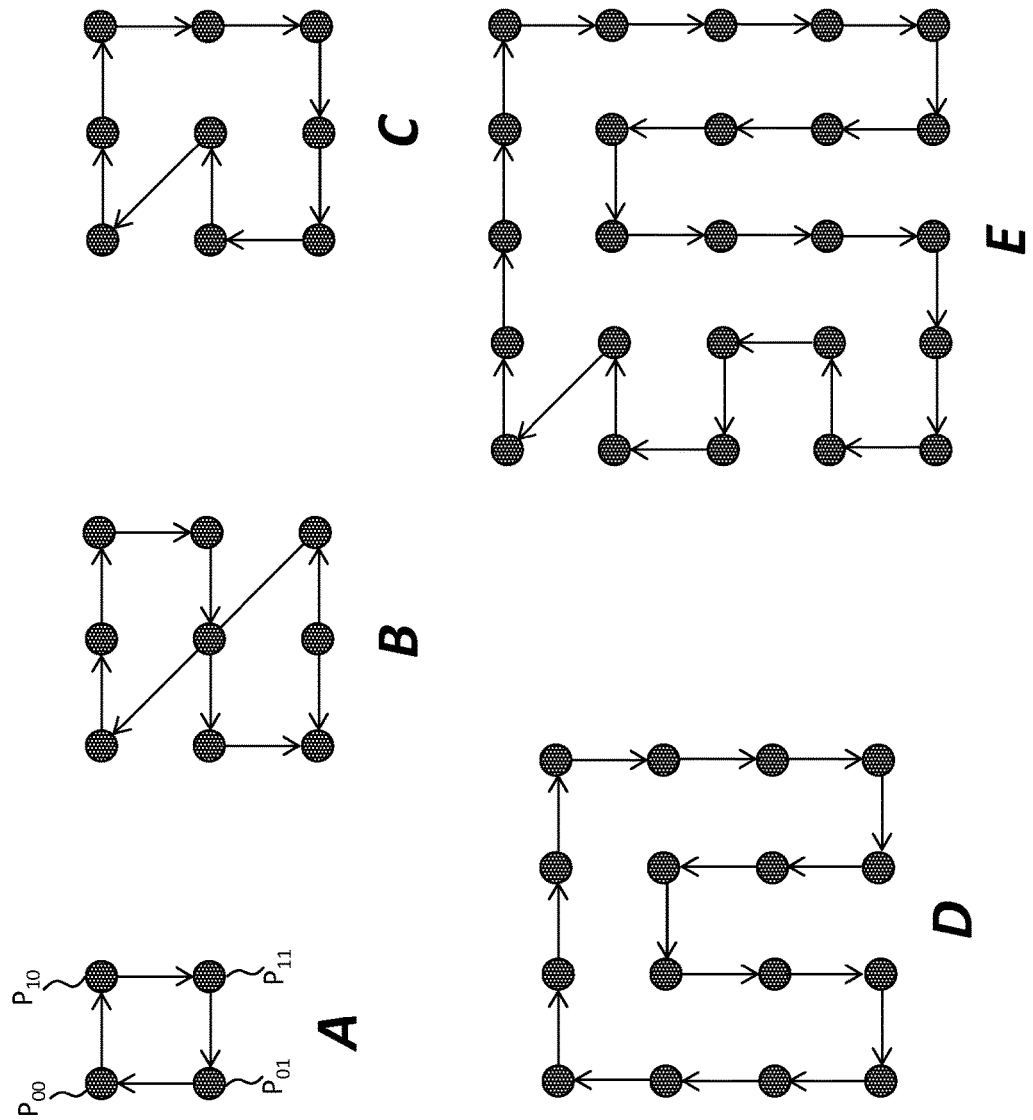
FIG. 7 illustrates dither patterns, according to illustrative embodiments of the present invention.

Five different exemplary dither patterns are illustrated in FIG. 7. In the first exemplary dither pattern, four-location dither pattern A, display pixels 20 on a display substrate 10 are moved from an upper-left spatial location $P_{00}$, to an upper right spatial location $P_{10}$, to a lower-right spatial location $P_{11}$, to a lower-left spatial location $P_{01}$, and then returns to the original, upper-left spatial location $P_{00}$ at successive times (as shown in FIGS. 2A-2D). The spatial locations of the display pixels 20 at successive times are adjacent.

In the second exemplary dither pattern, nine-location dither pattern B, display pixels 20 on a display substrate 10 are moved from an upper-left spatial location in the horizontal direction to an upper right spatial location and then down to a middle row of spatial locations. The display pixels 20 then move back to the first column, then down to the bottom row and across to the right side of the 3×3 array of spatial locations, and then back to the original spatial location. Spatial locations at successive times are adjacent except for the return to the original spatial location.

In the third exemplary dither pattern, nine-location dither pattern C, display pixels 20 on a display substrate 10 are moved from an upper-left spatial location in the horizontal direction to an upper right spatial location and then down the right-side column of spatial locations to the bottom row of spatial locations. The display pixels 20 then move back to the first column, then up to the middle row, over to the middle column, and then diagonally back to the original spatial location. In this exemplary 3×3 dither pattern, spatial locations at successive times are all adjacent except for the return to the original spatial location.

In the fourth exemplary dither pattern, sixteen-location dither pattern D, display pixels 20 on a display substrate 10 are moved from an upper-left spatial location in the horizontal direction to an upper right spatial location and then down the right-side column of spatial locations to the bottom row of spatial locations. The display pixels 20 then move back one column, then up to the second row, over another column, and then back to the bottom row of spatial locations. The display pixels 20 then move back to the first column and then to the original spatial location. In this exemplary 4×4 dithered pattern, spatial locations at successive times are all adjacent.

In the fifth exemplary dither pattern, twenty-five-location dither pattern E, display pixels 20 on a display substrate 10 are moved from an upper-left spatial location in the horizontal direction to an upper right spatial location and then down the right-side column of spatial locations to the bottom row of spatial locations. The display pixels 20 then move left one column, up to the second row, left another column, down to the bottom row, and then back and forth up to the original spatial location with alternating row and column movements. In this exemplary 5×5 dither pattern, spatial locations at successive times are all adjacent except for the return to the original spatial location.

The dither patterns of FIG. 7 define rectilinear arrays of display pixel locations. In some embodiments of the present invention, dither patterns can have other shapes, for example diamond shapes, circular shapes, or sinusoidal shapes. Referring to the FIG. 8, patterns A and B, display pixels 20 are spatially interpolated over time to form a diamond pattern alphabetically labeled in the order in which the interpolation occurs ($P_A$, $P_B$, $P_C$, $P_D$). In pattern C, two adjacent diamond patterns are formed in the order ($P_A$, $P_B$, $P_C$, $P_D$, $P_E$, $P_F$, $P_G$, $P_H$), with the central location ($P_C$, $P_G$), repeated. Motion of display pixels 20 need not be straight lines as in FIG. 8 pattern A. As shown in FIG. 8 patterns B and C, the display pixels 20 can trace out a circular pattern or a sinusoidal pattern (not shown). Thus, in some embodiments of the present invention, piezo actuators move a display substrate in all or a part of a straight line segment, a curved line segment, a circular line segment, a circle, a sinusoidal line segment, or a sine wave.

Figure 9:
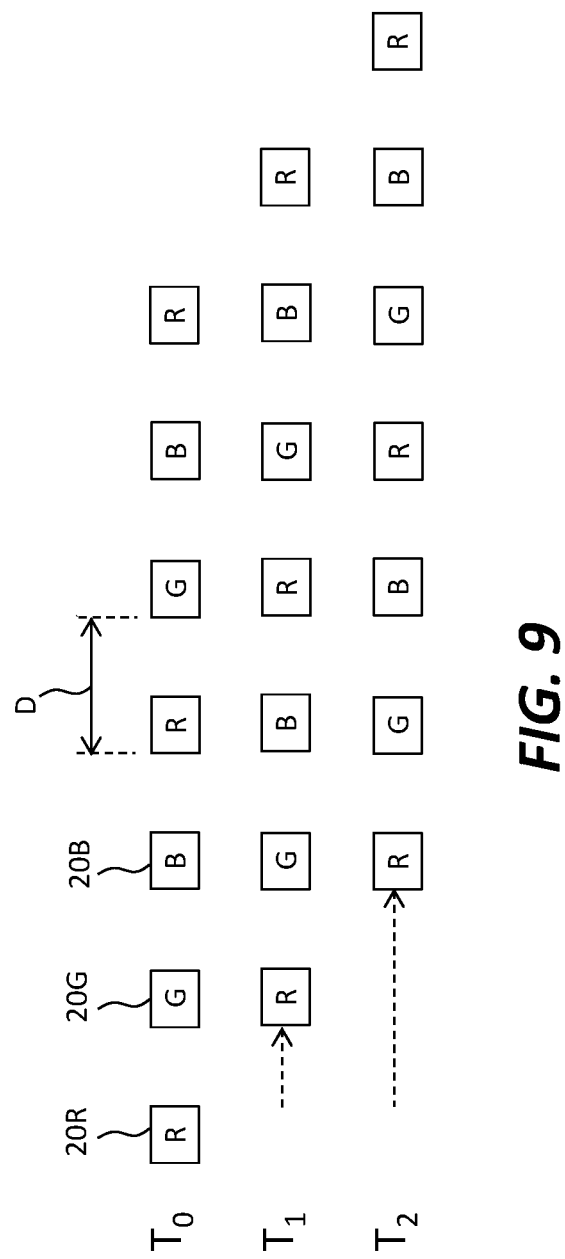
FIG. 9 illustrates one-dimensional dither patterns for single-color pixels, according to illustrative embodiments of the present invention.

In some embodiments of the present invention, and as illustrated in FIG. 9, each display pixel 20 on a display substrate 10 is a single-color display pixel 20 and adjacent display pixels 20 are different single-color display pixels 20 (i.e., that each emit a different single color). The display substrate 10 then moves a distance at least equal to the separation distance D to display different colors at the different pixel display locations. Hence, in such embodiments, a display 99 is a color sequential high-resolution display 99, but each different color is out of phase with the other colors at different neighboring spatial locations. Such a display can display an image in accordance with the exemplary method shown in FIG. 4. For example, with reference to FIG. 9, at time 0 ($T_0$) the first display pixel 20R emits red light at a first spatial location, the second display pixel 20G at a second spatial location adjacent to the first spatial location emits green light, and the third display pixel 20B adjacent to the second spatial location emits blue light. At a successive time $T_1$, the display substrate 10 is moved so that each of the single-color display pixels 20 is moved to an adjacent spatial location so that red display pixel 20R is moved to the second spatial location and emits red light, green display pixel 20G is moved to the third spatial location and emits green light, and blue display pixel 20B is moved to a fourth spatial location to emit blue light. At a second successive time $T_2$, the display substrate 10 is moved so that each of the single-color display pixels 20 is moved to another adjacent spatial location so that red display pixel 20R is moved to the third spatial location and emits red light, green display pixel 20G is moved to the fourth spatial location and emits green light, and blue display pixel 20B is moved to a fifth spatial location and emits blue light. The display substrate 10 is then moved back to its original position and the process is repeated for a second image frame. Thus, at the first spatial location red light is emitted, then green light, then blue light, corresponding to the different colors of the image pixel at the first spatial location. At the second spatial location green light is emitted, then red light, then blue light, corresponding to the different colors of the image pixel at the second spatial location. At the third spatial location blue light is emitted, then green light, then red light, corresponding to the different colors of the image pixel at the third spatial location.

Figure 10:
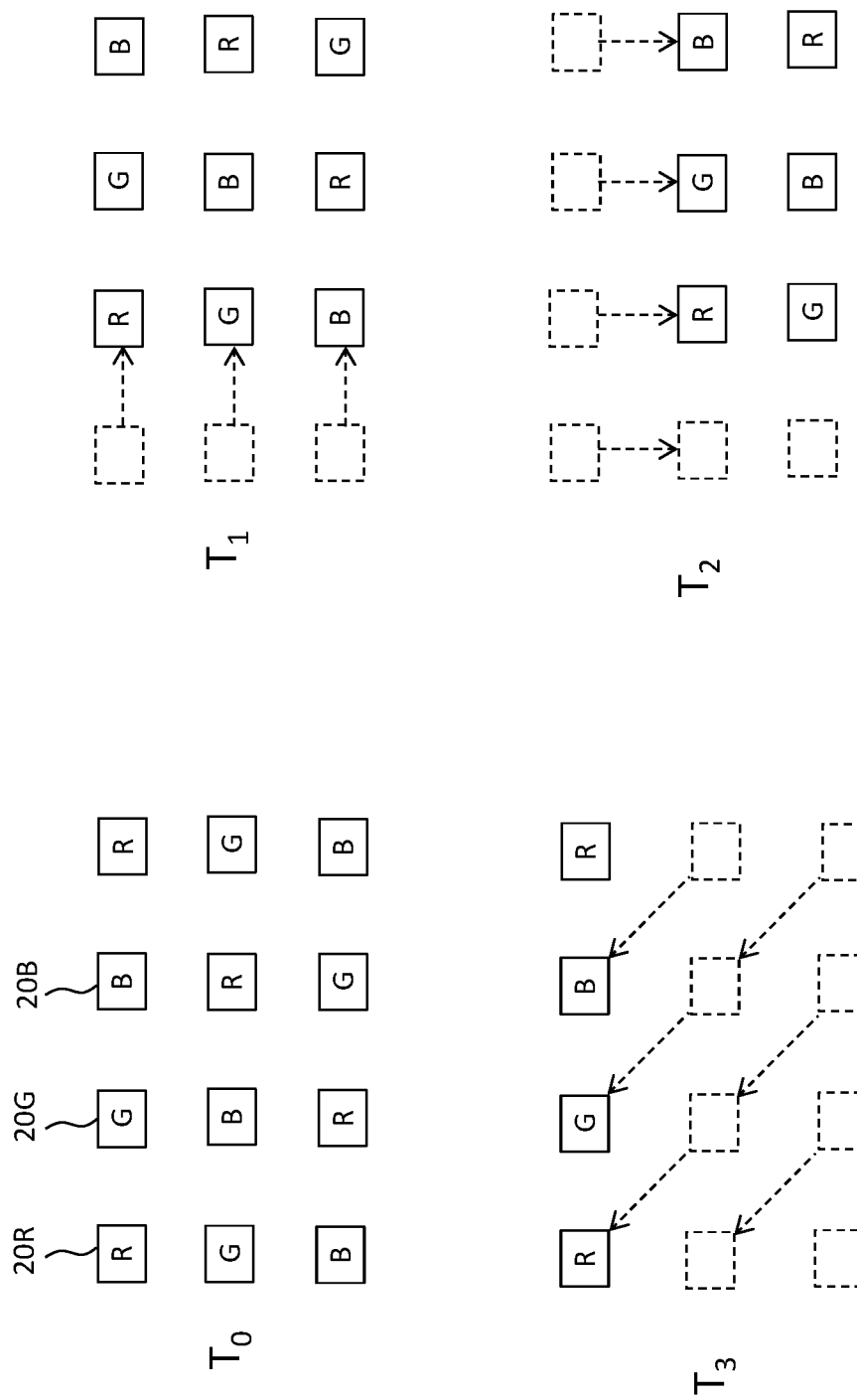
FIG. 10 illustrates two-dimensional dither patterns for single-color pixels, according to illustrative embodiments of the present invention.

Referring to FIG. 10, a similar process as described above can be used for a two-dimensional dither pattern if the dither pattern is arranged so that each color is emitted at each spatial location, for example by locating different single-color display pixels 20 spatially out of phase in adjacent rows (or columns) of the high-resolution display 99. As shown in FIG. 10, the display pixels 20 on the display substrate 10 first emit light at the initial spatial location at time $T_0$, then move to the right to emit light at the first spatial location at time $T_1$, then move down to emit light at the second spatial location at time $T_2$, then move back to the initial spatial location at time $T_3$, so that a different color of light is sequentially emitted at each spatial location. Alternatively, the display pixels 20 on the display substrate 10 can move left at time $T_3$ and emit light in the fourth spatial location and then return to the initial spatial location. Such a process will order the colors at each spatial location differently for successive time frames.

In some embodiments of the present invention, spatial locations between single-color display pixels 20 can also be interpolated in one or two dimensions (e.g., in accordance with FIGS. 2A-2D), to further increase the resolution of a high-resolution display 99.

Figure 11:
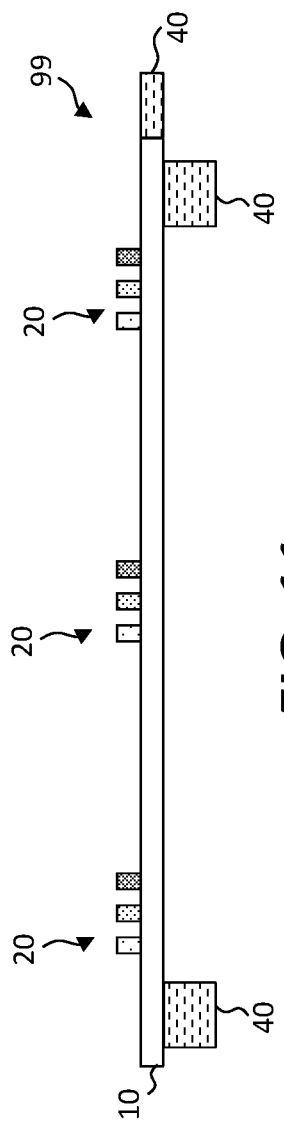
FIG. 11 is a cross section of a high-resolution display comprising z-direction actuators, according to illustrative embodiments of the present invention.

Referring to FIG. 11, in some embodiments of the present invention, an actuator 40 is located beneath (or above) a display substrate 10 to provide motion in the z direction orthogonally to the surface of the display substrate 10 on which an array of light-emitting display pixels 20 are disposed. In some embodiments, a three-dimensional image can be represented by emitting light at different depth directions at different times.

In some embodiments, if actuators 40 are controlled by a display controller 30 to operate out of phase, a surface of a display substrate 10 can be oriented in different directions (tilted). In some embodiments, if display pixels 20 comprise light-emitting lasers, for example laser diodes, then light can be emitted in different directions, for example providing different images to different viewers or to the different eyes of a single viewer.

In some embodiments of the present invention, piezo actuators move a display substrate in a resonant mechanical mode in one or both of a horizontal plane parallel to or a vertical plane orthogonal to a surface of the display substrate on which an array of light-emitting display pixels are disposed. Resonant mechanical motion at resonant frequencies of a display substrate 10 can enable a reduced power and a higher frame rate of display substrate 20 motion. Furthermore, in some embodiments, a display substrate 10 is tilted by operating actuators 40 out of phase or by providing actuators 40 at only some of the sides or edges of a display substrate 10, the display substrate itself can vibrate, bending in response to actuator 40 mechanical impulse. Vibration can be mechanically resonant and can cause display pixels 20 to emit light in different directions over time, reducing brightness in one direction while increasing the volume of space into which light is emitted by the display pixels 20.

Figure 12:
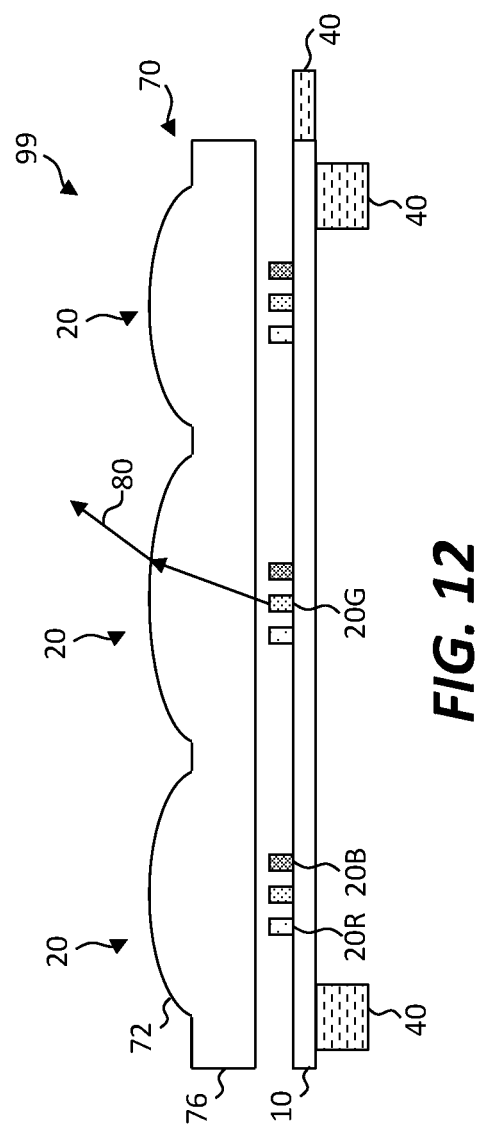
FIG. 12 is a cross section of a high-resolution display comprising an optical structure incorporating lenslets, according to illustrative embodiments of the present invention.

Referring to FIG. 12, in some embodiments of the present invention, a high-resolution display 99 comprises an optical structure 70 disposed in combination with an array of display pixels 20 so that light emitted by the display pixels 20 is optically processed by the optical structure 70 and piezo actuators 40 move the display substrate 10 relative to the optical structure 70. The optical structure 70 can have its own actuators 40 or not (as shown). An optical structure 70 can be any one or more of a variety of optical elements, for example a lenslet array having a lenslet 72 disposed on an optical substrate 76 and disposed in combination with each display pixel 20, as shown in FIG. 12. In some embodiments, as an actuator moves display pixels 20 relative to the lenslets 72, light 80 emitted from the display pixels 20 can be optically processed in different ways, for example refracted in different directions.

Referring to FIGS. 13A-13C, in some embodiments, an optical structure is a color-filter array 74 disposed on a transparent optical substrate 76. In some embodiments, for example, display pixels 20 can be single-emitter pixels that emit white light. As an actuator 40 moves a color-filter array 74 relative to the display pixels 20, white light emitted from the display pixels is successively processed by filtering the emitted white light with a red (FIG. 13A), green (FIG. 13B), and blue (FIG. 13C) color filter.

Referring to FIG. 14, in some embodiments, a plurality of display substrates 10 can be substantially transparent (within the limits of the materials and manufacturing processes, for example, greater than 50%, 60%, 70%, 80% or 90% transparent) and stacked to form a multi-layer high-resolution display 99. If the display substrates 10 are controlled by a display controller 30 to locate display pixels 20 in different layers at different locations, light from the different display pixels 20 can be emitted from each layer at the same time, providing a higher resolution and frame rate, and, if desired, a three-dimensional display. In some embodiments, for example in accordance with FIGS. 10 and 11, each layer can provide a three-dimensional image at successive times, and the combination of layers at the successive times forms a high-resolution three-dimensional display 99 with an increased depth.

In some embodiments, an actuator 40 never fully stops in a specific position but continues moving as image pixels are displayed. This will blur the displayed pixels but for such short times and distances that the effect is not noticeable.

In some embodiments, using a 2×2 dither pattern, an actuator 40 has a range of motion for moving a display substrate 10 of at least one half of a pixel separation distance D in size. In some embodiments, using a 3×3 dither pattern, an actuator 40 has a range of motion for moving a display substrate 10 of at least two thirds of a pixel separation distance D in size. In some embodiments, using a 4×4 dither pattern, an actuator 40 has a range of motion for moving a display substrate 10 of at least three quarters of a pixel separation distance D or at least the pixel separation distance D in size. In some embodiments, an actuator 40 moves a display substrate 10 a distance equal to a pixel separation distance D or a distance twice the pixel separation distance D (for example if three different single-color display pixels 20 are used).

In some embodiments, in which display pixels 20 include multiple sub-pixels, light-emitting sub-pixels are separated by a distance P that is less than or equal to one quarter of the separation distance. In some embodiments, this helps to avoid blur and ensure that sub-pixels are not moved to a location that overlaps a different sub-pixel in a different display pixel 20.

Figure 15:
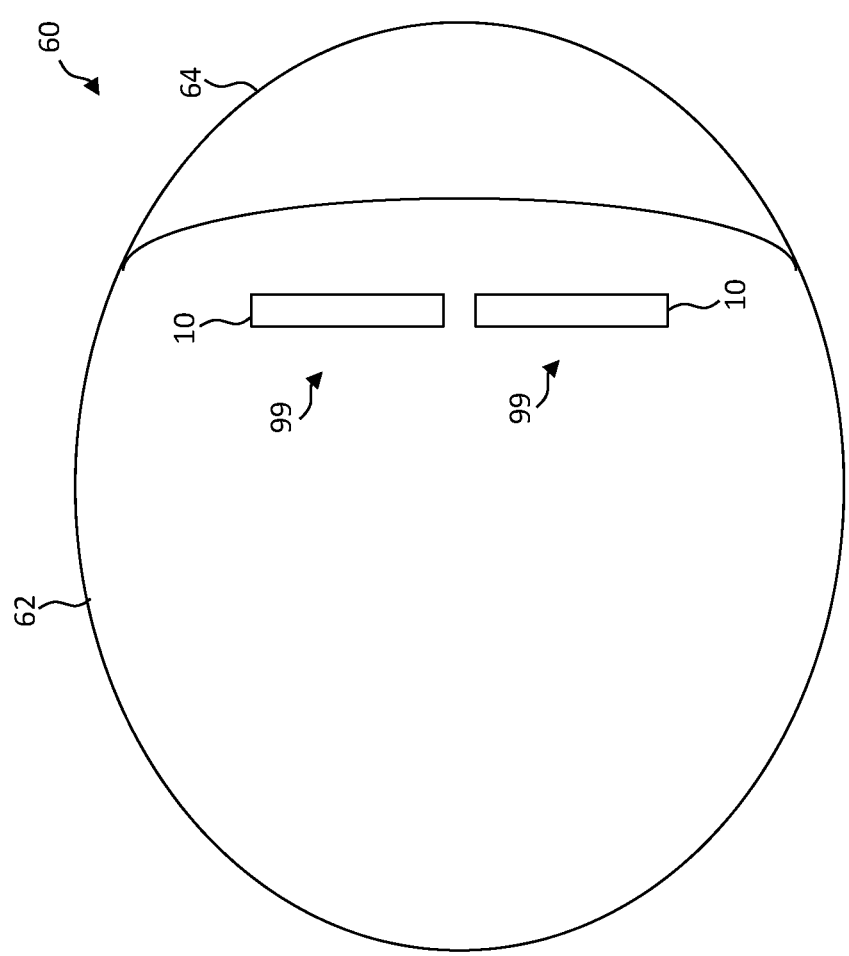
FIG. 15 is a schematic illustration of a head-mounted display, according to illustrative embodiments of the present invention.

In some embodiments, as shown in FIG. 15, a high-resolution display 99 includes a head set 60 (for example a head-mounted display with a strap 62 and a visor 64) to which a display substrate 10 is mounted to make an augmented or virtual reality display. In some embodiments, at least a display substrate, an array of light-emitting display pixels, and at least one actuator are mounted to a head set. In some embodiments, a controller is also mounted to the headset. In some embodiments, a head set 60 includes two high-resolution displays 99, each comprising an array of light-emitting display pixels 20.

Micro-LEDs 50 used in high-resolution displays 99 can comprise semiconductor structures such as silicon, or semiconductor structures that are compound semiconductor structures, for example GaN. Different micro-LEDs 50 that emit different colors of light can be made using different semiconductors, such as different compound semiconductors. Micro-LEDs 50 can be inorganic LEDs and can include dielectric materials, for example silicon dioxide or nitride to protect the micro-LEDs 50 and provide tethers 52 (e.g., that can be fractured) for use in transfer printing (e.g., micro-transfer printing). Micro-LEDs 50 having various structures can be made using, for example, doped or undoped semiconductor materials and can be made using photolithographic techniques. A display pixel 20 can comprise one or more inorganic LEDs (iLED) such as micro-LEDs 50. In some embodiments, solid-state lasers (e.g., diode lasers such as micro diode lasers) are used as light emitters in a display pixel 20. It is understood that where reference is made to an LED in a display pixel 20, a comparably sized diode laser can be used in place of the LED or micro-LED. Micro-LEDs 50 can be relatively small, for example in embodiments each micro-LED 50 has at least one of a width from 2 to 5 µm, 5 to 10 µm, 10 to 20 µm, or 20 to 50 µm, a length from 2 to 5 µm, 5 to 10 µm, 10 to 20 µm, or 20 to 50 µm, and a height from 2 to 5 µm, 4 to 10 µm, 10 to 20 µm, or 20 to 50 µm. In some embodiments, micro-LEDs 50 are formed in substrates or on supports separate, distinct, and independent from a display substrate 10.

According to some embodiments of the present invention, display pixels 20 incorporate micro-elements, such as micro-inorganic-light-emitting diodes and micro-controllers (e.g., pixel controllers 24 as shown in FIG. 6) having micron-sized dimensions. In some embodiments, because such micro-elements are so small, they take very little space and have very little mass, such that actuators 40 can reliably and repeatably move a display substrate 10 to form images on a high-resolution display 99. In some embodiments, small size enables a small aperture ratio (fill factor) of a display substrate 10 and provides space for the different spatial locations between the display pixels 20. Small mass can enable rapid movement and high frame rates, thereby increasing temporal resolution and reducing image flicker. In some embodiments, small size and mass of micro-controllers in display pixels 20 also enables an active-matrix control structure for a high-resolution display 99, thereby improving brightness.

Methods of forming micro-transfer printable structures are described, for example, in the paper *AMOLED Displays using Transfer-Printed Integrated Circuits* (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, the disclosure of each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled *Compound Micro-Assembly Strategies and Devices*, which is hereby incorporated by reference in its entirety. In some embodiments, a high-resolution display 99 (e.g., a display substrate 10 thereof) is a compound micro-assembled device. In some embodiments, display pixels 20 are micro-transfer printed onto a display substrate 10 [e.g., wherein the printed display pixels 20 comprise broken (e.g., fractured) tethers resulting from the micro-transfer printing process]. In some embodiments, light emitters such as micro-LEDs or laser diodes are micro-transfer printed onto a display substrate 10 [e.g., wherein the printed light emitters comprise broken (e.g., fractured) tethers resulting from the micro-transfer printing process]. In some embodiments, micro-controllers used in active matrix control of a pixel are micro-transfer printed onto a display substrate 10 [e.g., wherein printed micro-controllers comprise broken (e.g., fractured) tethers resulting from the micro-transfer printing process]. In some embodiments, components such as light emitters and, optionally, micro-controllers are micro-transfer printed onto an intermediate substrate in order to form a display pixel 20, and the display pixel 20 is then micro-transfer printed onto a display substrate. Additional details useful in some embodiments are described in U.S. patent application Ser. No. 14/743,981, filed Jun. 18, 2015, entitled *Micro Assembled LED Displays and Lighting Elements*, the disclosure of which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in."

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

D pixel separation distance
P sub-pixel separation distance
$P_{00}$ position 00
$P_{01}$ position 01
$P_{10}$ position 10
$P_{11}$ position 11
$P_A$, $P_B$, $P_C$, $P_D$, $P_E$, $P_F$, $P_G$, $P_H$ display pixel position
10 display substrate
20 display pixel
20R red pixel/sub-pixel
20G green pixel/sub-pixel
20B blue pixel/sub-pixel
22 wires
24 pixel controller
30 display controller
40 actuator
50 inorganic micro-light-emitting diode
52 tether
60 headset
62 strap
64 visor
70 optical structure
72 lenslet
74 color-filter array
74R red color filter
74G green color filter
74B blue color filter
76 optical substrate
80 light
99 high-resolution display
400 providing display step
402 initial emitting light step
404 moving display step
406 emitting light step
408 determine progress in dither pattern step
410 load new image step

What is claimed:

1. A high-resolution display, comprising:
   a display substrate;
   an array of light-emitting display pixels disposed on the display substrate;
   at least one actuator for physically moving the display substrate and the array of light-emitting display pixels to different physical locations in at least one dimension in a direction parallel to a surface of the display substrate;
   a controller for controlling the light-emitting operation of the display pixels and for controlling a spatial location of the display pixels; and
   wherein the controller controls the at least one actuator to interpolate the spatial location of the display pixels at successive times and controls the light-emitting operation of the display pixels to display a different subset of image pixels in an image at each successive time, wherein a total number of display pixels in the array of light-emitting display pixels is less than and evenly divides a total number of image pixels in the image in at least one dimension,
   wherein the light-emitting display pixels comprise inorganic micro-light-emitting diodes having at least one of a length, a width, and a thickness that is less than or equal to twenty microns, wherein each of the micro-light-emitting diodes comprises a semiconductor material and a dielectric material that protects the micro-light-emitting diode, and wherein each of the display pixels comprises two or more sub-pixels comprising at least one of the micro-light-emitting diodes, wherein each of the at least one of the micro-light-emitting diodes is a micro-transfer printed micro-light-emitting diode comprising a fractured or separated tether laterally extending from the dielectric material.

2. The high-resolution display of claim 1, wherein the display pixels are color pixels comprising two or more light-emitting sub-pixels and the controller controls the sub-pixels to emit light of different colors.

3. The high-resolution display of claim 1, wherein each spatial location of the display pixels that the controller controls the at least one actuator to move the display substrate to at a successive time of the successive times corresponds to a relative location of image pixels in the image displayed by the display pixels at the successive time.

4. The high-resolution display of claim 1, wherein a total number of spatial locations the controller controls the at least one actuator to move to is the same as the total number of image pixels in the image.

5. The high-resolution display of claim 1, wherein the spatial locations are interpolated in one dimension.

6. The high resolution display of claim 1, wherein the spatial locations are interpolated in two directions.

7. The high-resolution display of claim 6, wherein the two directions are two orthogonal directions.

8. The high-resolution display of claim 1, wherein the spatial locations at successive times correspond to adjacent image pixels in the image.

9. The high-resolution display of claim 1, wherein the controller controls the at least one actuator to move continuously along a dither pattern.

10. The high-resolution display of claim 1, wherein each display pixel is separated from a neighboring pixel by a pixel separation distance and each of the at least one actuator has a range of motion for moving the display substrate that is at least equal to the pixel separation distance.

11. The high-resolution display of claim 10, wherein each display pixel is a single-color display pixel and adjacent display pixels emit different single-colors of light.

12. The high-resolution display of claim 1, comprising an actuator for physically moving the display substrate and the array of light-emitting display pixels in a direction orthogonal to a surface of the display substrate on which the array of light-emitting display pixels are disposed.

13. The high-resolution display of claim 1, wherein the display substrate is substantially transparent and the high-resolution display comprises at least one additional display substrate each comprising an array of light-emitting display pixels disposed thereon and at least one actuator for physically moving the additional display substrate and the array of light-emitting display pixels disposed thereon to different spatial locations at least one dimension parallel to a surface of the display substrate, wherein the display substrate and the at least one additional display substrate form a stack of display substrates.

14. The high-resolution display of claim 1, wherein each display pixel is separated from a neighboring display pixel by a pixel separation distance and each of the at least one actuator has a range of motion for moving the display substrate of at least one half of the pixel separation distance.

15. The high-resolution display of claim 1, wherein each display pixel is separated from a neighboring pixel by a pixel separation distance, wherein the display pixels are color pixels comprising two or more light-emitting sub-pixels, and the two or more light-emitting sub-pixels in a color pixel are separated by a distance that is less than or equal to one quarter of the pixel separation distance.

16. The high-resolution display of claim 1, wherein each light-emitting display pixel in the array of light-emitting display pixels comprises an active-matrix pixel controller.

17. The high-resolution display of claim 1, wherein the at least one actuator is (i) one or more piezo actuators disposed to move the display substrate in one dimension; (ii) two or more piezo actuators disposed to move the display substrate in two dimensions; or (iii) three or more piezo actuators disposed to move the display substrate in three dimensions.

18. The high-resolution display of claim 1, comprising an optical structure disposed over the array of display pixels such that light emitted by the display pixels is optically processed by the optical structure, wherein the at least one actuator is for moving the display substrate relative to the optical structure.

19. The high-resolution display of claim 18, wherein the at least one actuator moves the display substrate in at least one of (i) at least a portion of a straight line segment, a curved line segment, a circle, a circular line segment, a sinusoidal line segment, a sine wave, and (ii) a resonant mechanical mode in one or both of a horizontal plane parallel and a vertical plane orthogonal to a surface of the display substrate on which the array of light-emitting display pixels are disposed.

20. The high-resolution display of claim 1, comprising a head set, wherein at least the display substrate, the array of light-emitting display pixels, and the at least one actuator are mounted to the head set.

* * * * *

UNITED STATES PATENT AND TRADEMARK OFFICE
CERTIFICATE OF CORRECTION

| | | |
|---|---|---|
| PATENT NO. | : 10,347,168 B2 | Page 1 of 1 |
| APPLICATION NO. | : 15/808126 | |
| DATED | : July 9, 2019 | |
| INVENTOR(S) | : Meitl et al. | |

It is certified that error appears in the above-identified patent and that said Letters Patent is hereby corrected as shown below:

On the Title Page

At Item (54) Line 1 and in the Specification at Column 1, Line 1:
Please replace:
"SPATIALLY DITHERED HIGH-RESOLUTION"
With:
--SPATIALLY DITHERED HIGH-RESOLUTION DISPLAYS--

Signed and Sealed this
Third Day of September, 2019

Andrei Iancu
*Director of the United States Patent and Trademark Office*